US007446625B2

(12) United States Patent
Otsuka et al.

(10) Patent No.: US 7,446,625 B2
(45) Date of Patent: Nov. 4, 2008

(54) NARROW IMPEDANCE CONVERSION DEVICE

(75) Inventors: Kanji Otsuka, 1074-38, Kohan 2-chome, Higashiyamato-shi, Tokyo (JP) 207-0002; Tamotsu Usami, 38-4, Nishimachi 2-chome, Kokubunji-shi, Tokyo (JP) 185-0035; Yutaka Akiyama, 120-12, Katakura-machi, Hachioji-shi, Tokyo (JP) 192-0914

(73) Assignees: Kanji Otsuka (JP); Tamotsu Usami (JP); Yutaka Akiyama (JP); Oki Electric Industry Co., Ltd. (JP); Kabushiki Kaisha Toshiba (JP); Fujitsu Limited (JP); Renesas Technology Corp. (JP); Kyocera Corporation (JP); Fuji Xerox Co., Ltd. (JP)

( * ) Notice: Subject to any disclaimer, the term of this patent is extended or adjusted under 35 U.S.C. 154(b) by 266 days.

(21) Appl. No.: 11/500,943

(22) Filed: Aug. 9, 2006

(65) Prior Publication Data

US 2007/0176708 A1 Aug. 2, 2007

(30) Foreign Application Priority Data

Jan. 30, 2006 (JP) ............................ 2006-020479

(51) Int. Cl.
*H03H 7/38* (2006.01)
*H01P 1/16* (2006.01)

(52) U.S. Cl. ....................... 333/35; 333/21 R; 333/121; 333/125; 333/166; 333/238

(58) Field of Classification Search ............ 333/32-33, 333/35, 21 R, 166, 121, 125, 238
See application file for complete search history.

(56) References Cited

U.S. PATENT DOCUMENTS 4,383,227 A * 5/1983 de Ronde .................... 333/121
5,523,622 A * 6/1996 Harada et al. ............... 257/734
5,812,034 A * 9/1998 Yoshida ...................... 333/125
6,023,209 A * 2/2000 Faulkner et al. ............. 333/238

FOREIGN PATENT DOCUMENTS

JP 10-224123 8/1998

* cited by examiner

*Primary Examiner*—Vibol Tan
(74) *Attorney, Agent, or Firm*—Studebaker & Brackett PC; Donald R. Studebaker

(57) ABSTRACT

An impedance conversion device has four conductors arranged so that the first and second conductors form a transmission line having a first characteristic impedance, the third and fourth conductors form a transmission line having the first characteristic impedance, the first and third conductors form a transmission line having a second characteristic impedance, and the second and fourth conductors form a third transmission line having the second characteristic impedance. The second and fourth conductors are interconnected at proximate ends through a resistance equal to the first characteristic impedance. The third and fourth conductors are interconnected at proximate ends through a resistance equal to the second characteristic impedance. The lateral dimensions of the impedance conversion device are small enough to permit insertion in a stacked pair line.

11 Claims, 20 Drawing Sheets

NARROW IMPEDANCE CONVERSION DEVICE

BACKGROUND OF THE INVENTION

1. Field of the Invention

The present invention relates to an impedance conversion device, and in particular to an impedance conversion device that can be inserted into a stacked pair line.

2. Description of the Related Art

An example of a conventional impedance conversion device that can be inserted in a transmission line is given in Japanese Patent Application Publication No. 10-224123. The disclosed device is designed for insertion into a microstrip line, however, and is too wide in the direction orthogonal to the line for insertion into a stacked pair line.

SUMMARY OF THE INVENTION

An object of the present invention is to provide an impedance conversion device that is narrow enough for insertion into a stacked pair line.

The invented impedance conversion device comprises first, second, third, and fourth conductors, each having a first end and a second end. The conductors are arranged so that the first and second conductors form a first transmission line having a first characteristic impedance, the first and third conductors form a second transmission line having a second characteristic impedance different from the first characteristic impedance, the second and fourth conductors form a third transmission line having the second characteristic impedance, and the third and fourth conductors form a fourth transmission line having the first characteristic impedance.

A first resistor having a resistance equal to the first characteristic impedance is connected between the second ends of the second and fourth conductors, which are mutually proximate. A second resistor having a resistance equal to the second characteristic impedance is connected between the first ends of the third and fourth conductors, which are mutually proximate.

The four conductors transmit a signal that is input at the first ends of the first and second conductors and output at the second ends of the first and third conductors. The fourth conductor preferably has a length not exceeding one-fourth of the fundamental wavelength of the transmitted signal.

The impedance of the transmitted signal is converted efficiently, and the dimensions of the impedance conversion device in the directions orthogonal to the longitudinal direction of the conductors are comparatively small, permitting the impedance converting device to be formed in a confined space and in particular to be inserted into a stacked pair line. Use of this impedance conversion device can contribute to a reduction in the size of microelectronic parts.

DETAILED DESCRIPTION OF THE INVENTION

Figure 1:
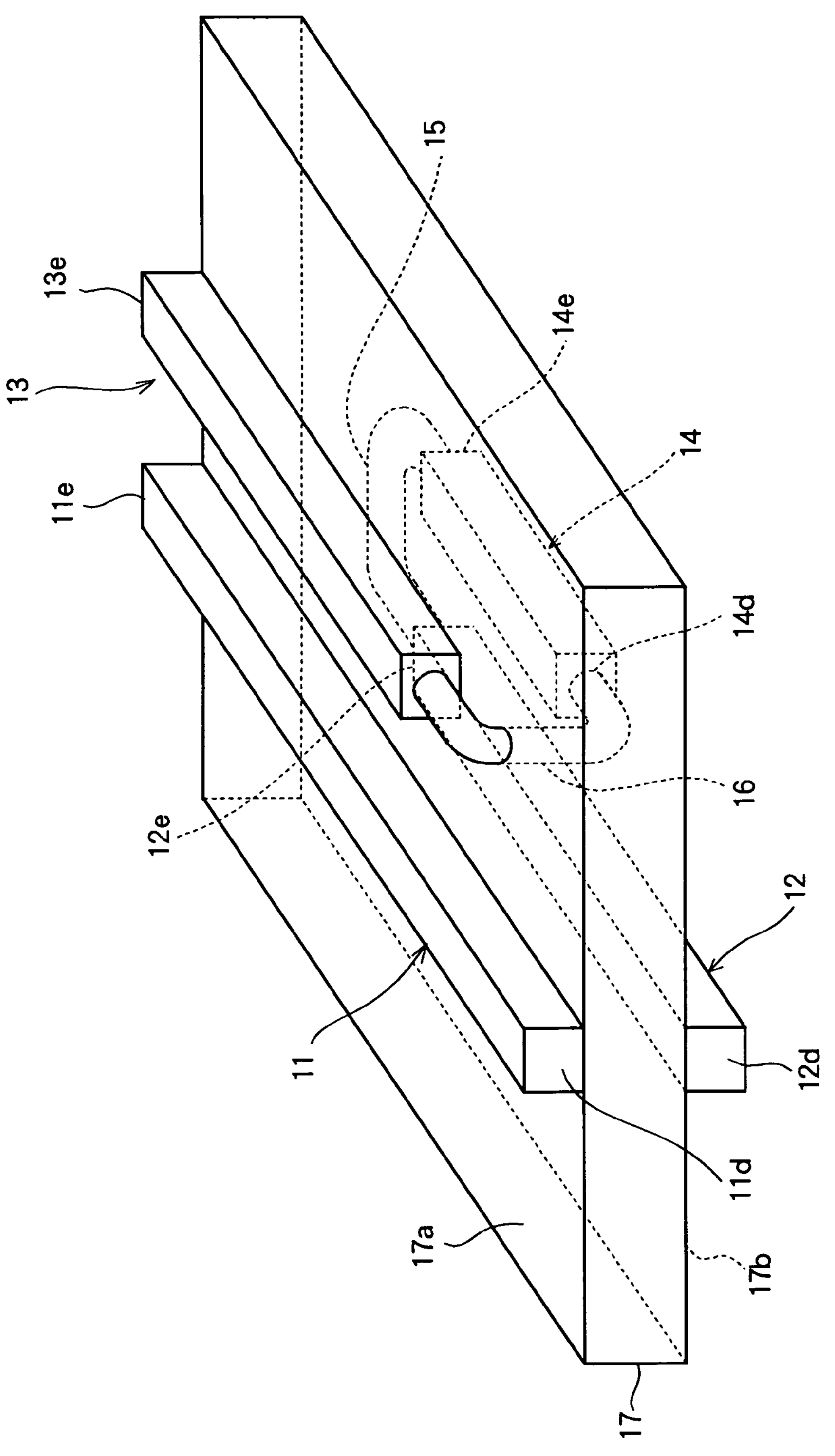
FIG. 1 is a perspective view of an impedance conversion device embodying the present invention.

An impedance conversion device embodying the invention will now be described with reference to the attached drawings, in which like elements are indicated by like reference characters.

As shown in FIGS. 1-7, the impedance conversion device comprises first, second, third, and fourth strip-like conductors 11, 12, 13, 14, first and second resistors 15, 16, and a dielectric sheet 17. The first to fourth conductors 11, 12, 13, 14 extend in mutually parallel straight lines.

The dielectric sheet 17 has a first surface or upper surface 17*a* (uppermost in FIGS. 1 and 4-7) and a second surface or lower surface 17*b*. The first and third conductors 11, 13 are disposed side by side on the upper surface 17*a* of the dielectric sheet 17, spaced apart from each other in a direction orthogonal to their lengths and parallel to the upper surface 17*a* and lower surface 17*b* of the dielectric sheet 17. The second and fourth conductors 12, 14 are similarly disposed side by side on the lower surface 17*b* of the dielectric sheet 17.

The first conductor 11 and the second conductor 12 are disposed on opposite sides of the dielectric sheet 17, facing each other in a direction orthogonal to the upper surface 17*a* and lower surface 17*b* of the dielectric sheet 17. The third conductor 13 and the fourth conductor 14 are similarly disposed on opposite sides of the dielectric sheet 17, facing each other.

Figure 2:
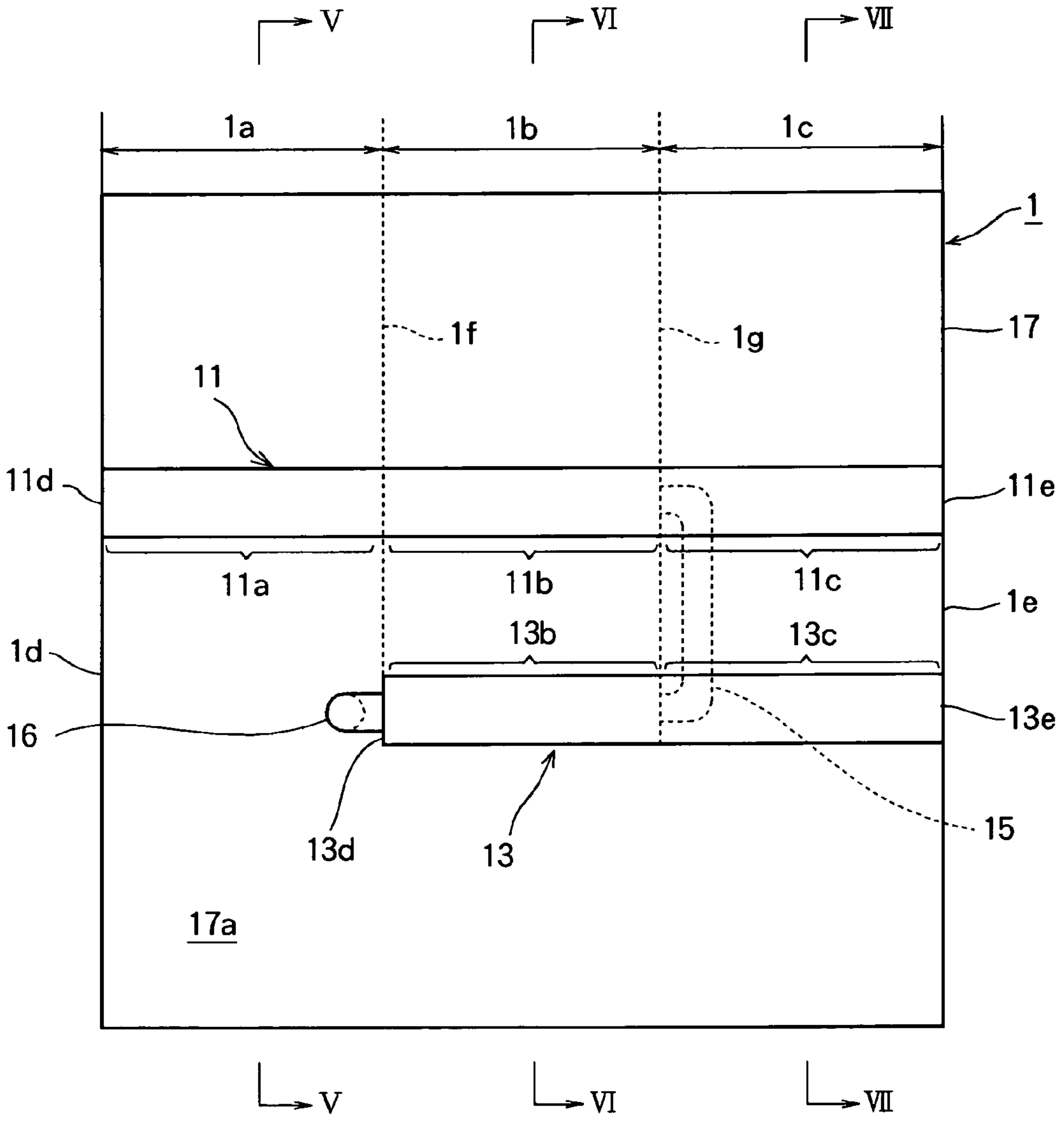
FIG. 2 is a top plan view of the impedance conversion device in FIG. 1.
Figure 3:
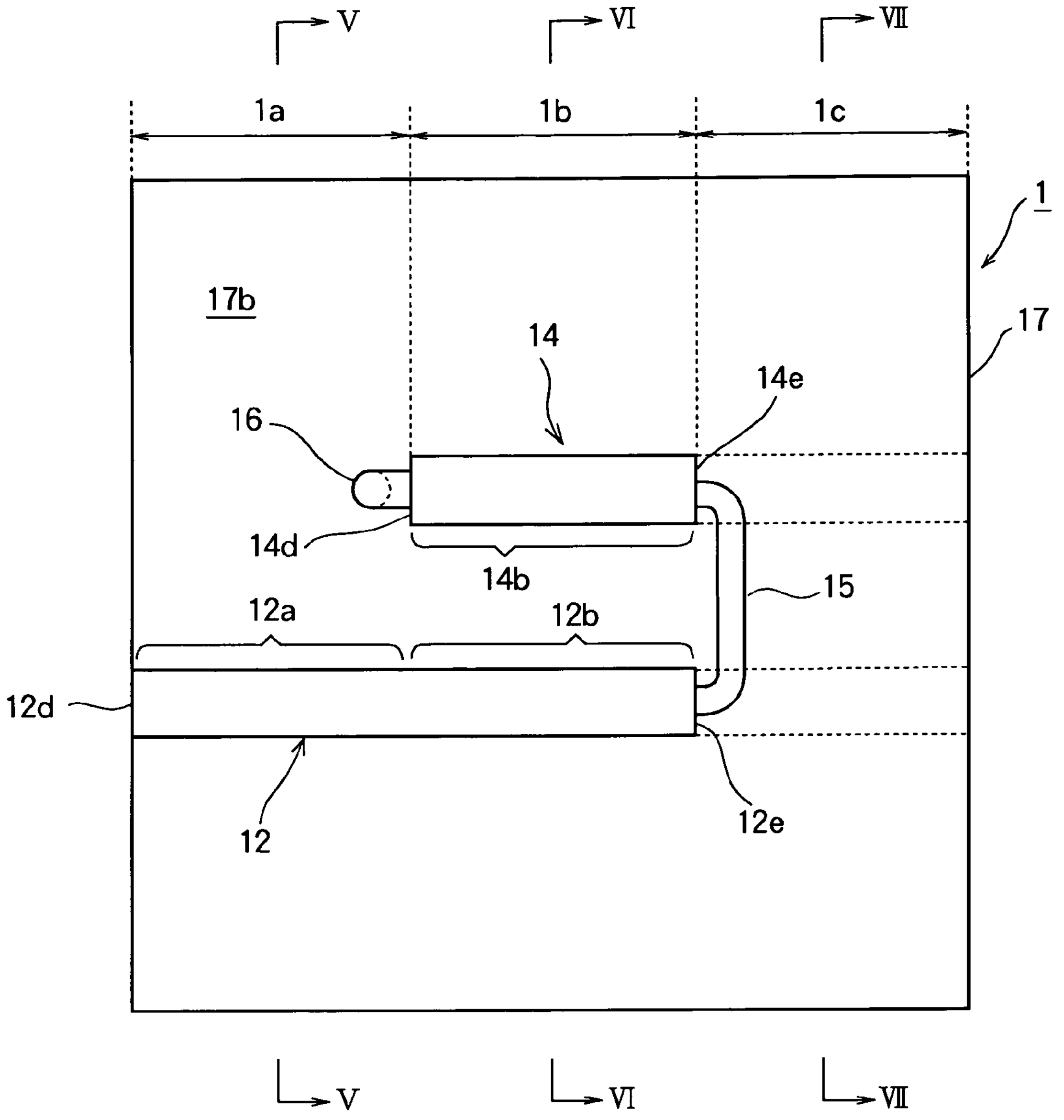
FIG. 3 is a bottom plan view of the impedance conversion device in FIG. 1.
Figure 4:
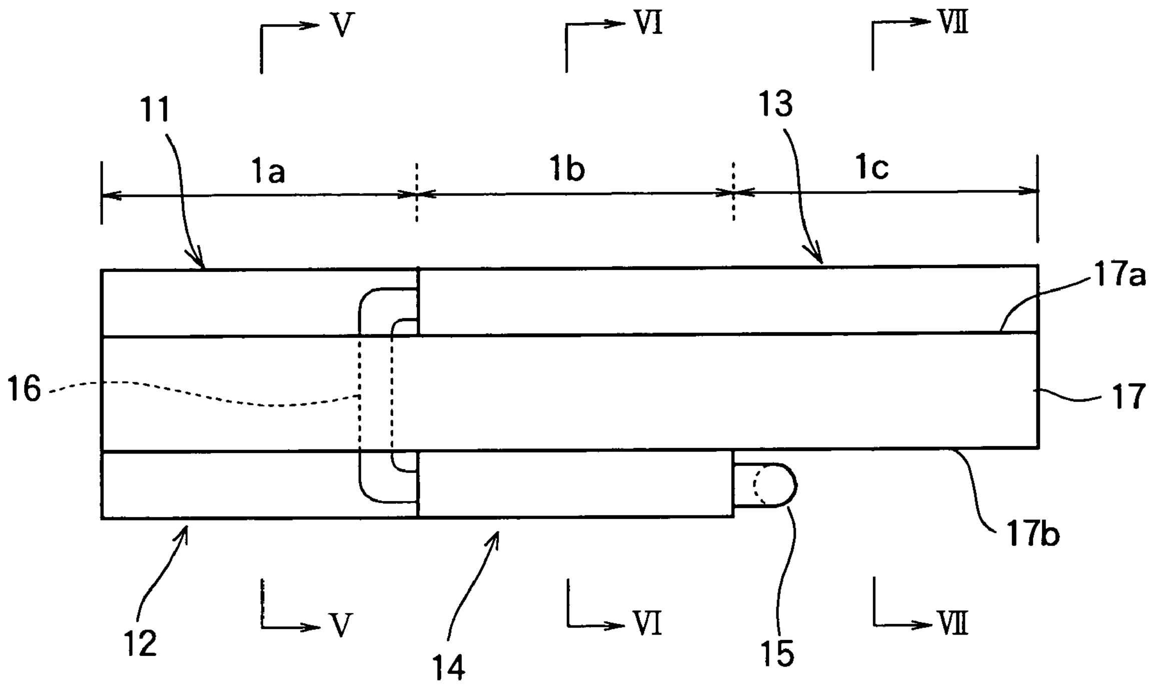
FIG. 4 is a side elevation view of the impedance conversion device in FIG. 1.
Figure 5:
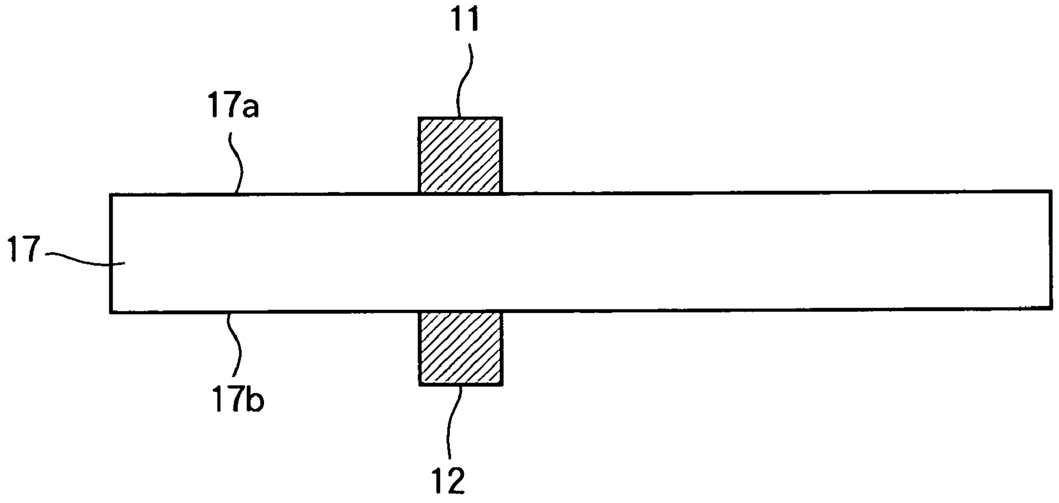
FIG. 5 is a sectional view through line V-V in FIGS. 2-4.
Figure 6:
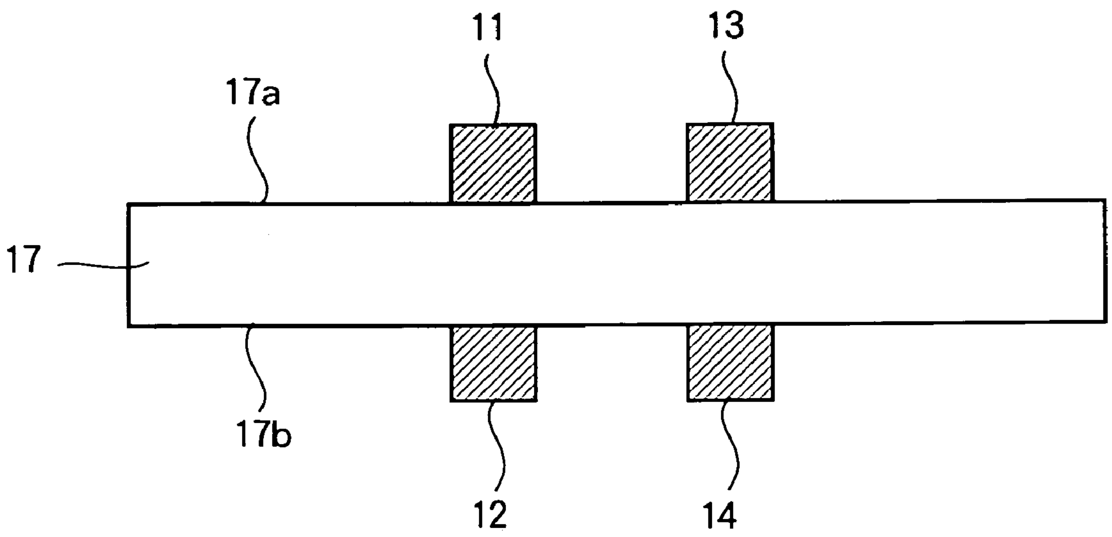
FIG. 6 is a sectional view through line VI-VI in FIGS. 2-4.
Figure 7:
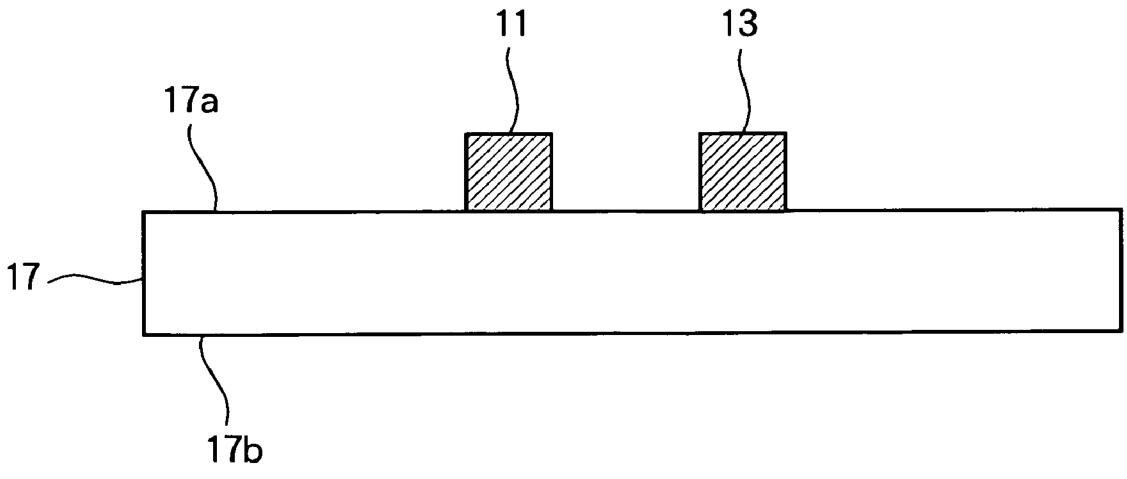
FIG. 7 is a sectional view through line VII-VII in FIGS. 2-4.

As shown in FIGS. 2-4, the impedance conversion device 1 has an input part or region 1*a*, a central part or region 1*b*, and an output part or region 1*c*. The input region 1*a* is the region near the input end 1*d* of the impedance conversion device 1; the output region 1*c* is the region near the output end 1*e* of the impedance conversion device 1. The central region 1*b* is the region between the input region 1*a* and the output region 1*c*. The input region 1*a*, the central region 1*b*, and the output region 1*c* are mutually contiguous.

The first conductor 11 extends across the input region 1*a*, the central region 1*b*, and the output region 1*c* of the impedance conversion device 1; the first conductor 11 has an input part 11*a*, a central part 11*b*, and an output part 11*c* disposed in the input region 1*a*, the central region 1*b*, and the output region 1*c*, respectively.

The second conductor 12 extends across the input region 1*a* and the central region 1*b* of the impedance conversion device 1, and has an input part 12*a* and a central part 12*b* disposed in the input region 1*a* and the central region 1*b*, respectively.

The third conductor 13 extends across the central region 1*b* and the output region 1*c* of the impedance conversion device 1, and has a central part 13*b* and an output part 13*c* disposed in the central region 1*b* and the output region 1*c*, respectively.

The fourth conductor 14 extends only across the central region 1*b*, and has a central part 14*b* disposed in the central region 1*b*.

The first conductor 11 and second conductor 12 form a transmission line having a first characteristic impedance z1.

The second conductor 12 and fourth conductor 14 form a transmission line having a second characteristic impedance z2 different from the first characteristic impedance z1.

The first conductor 11 and the third conductor 13 form a transmission line having the second characteristic impedance z2.

The third conductor 13 and the fourth conductor 14 form a transmission line having the first characteristic impedance z1.

The first conductor 11 is disposed so that one end (the input end) 11*d* is at the input end 1*d* of the impedance conversion device 1, and the other end (the output end) 11*e* is at the output end of the impedance conversion device 1.

The second conductor 12 is disposed so that one end (the input end) 12*d* is at the input end 1*d* of the impedance conversion device 1, and the other end (the output end) 12*e* is at the boundary 1*g* between the central region 1*b* and the output region 1*c* of the impedance conversion device 1.

The third conductor 13 is disposed so that one end (the input end) 13*d* is at the boundary 1*f* between the input region 1*a* and the central region 1*b* of the impedance conversion device 1, and the other end (the output end) 13*e* is at the output end 1*e* of the impedance conversion device 1.

The fourth conductor 14 is disposed so that one end (the input end) 14*d* is at the boundary 1*f* between the input region 1*a* and the central region 1*b* of the impedance conversion device 1, and the other end (the output end) is at the boundary 1*g* between the central region 1*b* and the output region 1*c* of the impedance conversion device 1.

The output end 12*e* of the second conductor 12 and the output end 14*e* of the fourth conductor 14 are both disposed on the lower surface 17*b* of the dielectric sheet 17 and are mutually proximate. The input end 13*d* of the third conductor 13 and the input end 14*d* of the fourth conductor 14 are disposed on the lower surface 17*b* and the upper surface 17*a* of the dielectric sheet 17, respectively, and are mutually proximate.

A first resistor 15 is mounted on the lower surface 17*b* of the dielectric sheet 17. The first resistor 15 interconnects the output end 12*e* of the second conductor 12 and the output end 14*e* of the fourth conductor 14, and has a resistance R1 equal to the first characteristic impedance z1.

A second resistor 16 is formed so that it extends through the dielectric sheet 17. The second resistor 16 interconnects the input end 13*d* of the third conductor 13 and the input end 14*d* of the fourth conductor 14, and has a resistance R2 equal to the second characteristic impedance z2.

The value (the absolute value) of the first characteristic impedance z1 is, for example, fifty ohms (50Ω), and the value (the absolute value) of the second characteristic impedance z2 is, for example, 82Ω.

The first to fourth conductors 11 to 14 have identical cross-sectional configurations, for example, a thickness (the vertical dimension in FIGS. 5-7) of 40 micrometers, and a width (the horizontal dimension in FIGS. 5-7) of 0.8 millimeters. (The dimensions in the drawings are not shown proportional to the actual dimensions.)

The dielectric sheet 17 has a thickness of 170 micrometers; the distance between the first conductor 11 and the second conductor 12 and the distance between the third conductor 13 and the fourth conductor 14 are equal to the thickness of the dielectric sheet 17.

The distance between the first conductor 11 and the third conductor 13 and the distance between the second conductor 12 and the fourth conductor 14 are identically 100 micrometers (0.1 millimeters).

The first to fourth conductors parallel each other in the central region 1*b*, which therefore may be referred to as the 'quadri-parallel' part below. In contrast, the input region 1*a* and the output region 1*c* may be referred to as 'duo-parallel' parts, as only the first and second conductors 11 and 12 are parallel in the input region 1*a*, and only the first and third conductors 11 and 13 are parallel in the output region 1*c*.

The length of the central region 1*b* of the impedance conversion device, that is, the length of conductor 14 (the length in the longitudinal direction in which conductors 11 to 14 extend) preferably does not exceed one-fourth of the fundamental wavelength of the signal that is transmitted, and is preferably at least ten times as long as the larger of the two distances that separate the first conductor 11 from the second conductor 12 and the first conductor 11 from the third conductor 13. More specifically, the length is preferably longer than 1/64 of the fundamental wavelength of the transmitted signal.

When the impedance conversion device 1 is configured as above, its input impedance Zin is equal to the first characteristic impedance z1 (50Ω) and its output impedance Zout is equal to the second characteristic impedance z2 (82Ω). Impedance conversion therefore takes place. This was confirmed by using TDR (time domain reflectometry) to measure the impedance of the transmission lines.

TDR is carried out by transmitting a pulsed signal and observing the reflection of the pulse from the circuit under test; TDR detects changes in impedance along the transmission path of the signal.

Figure 8:
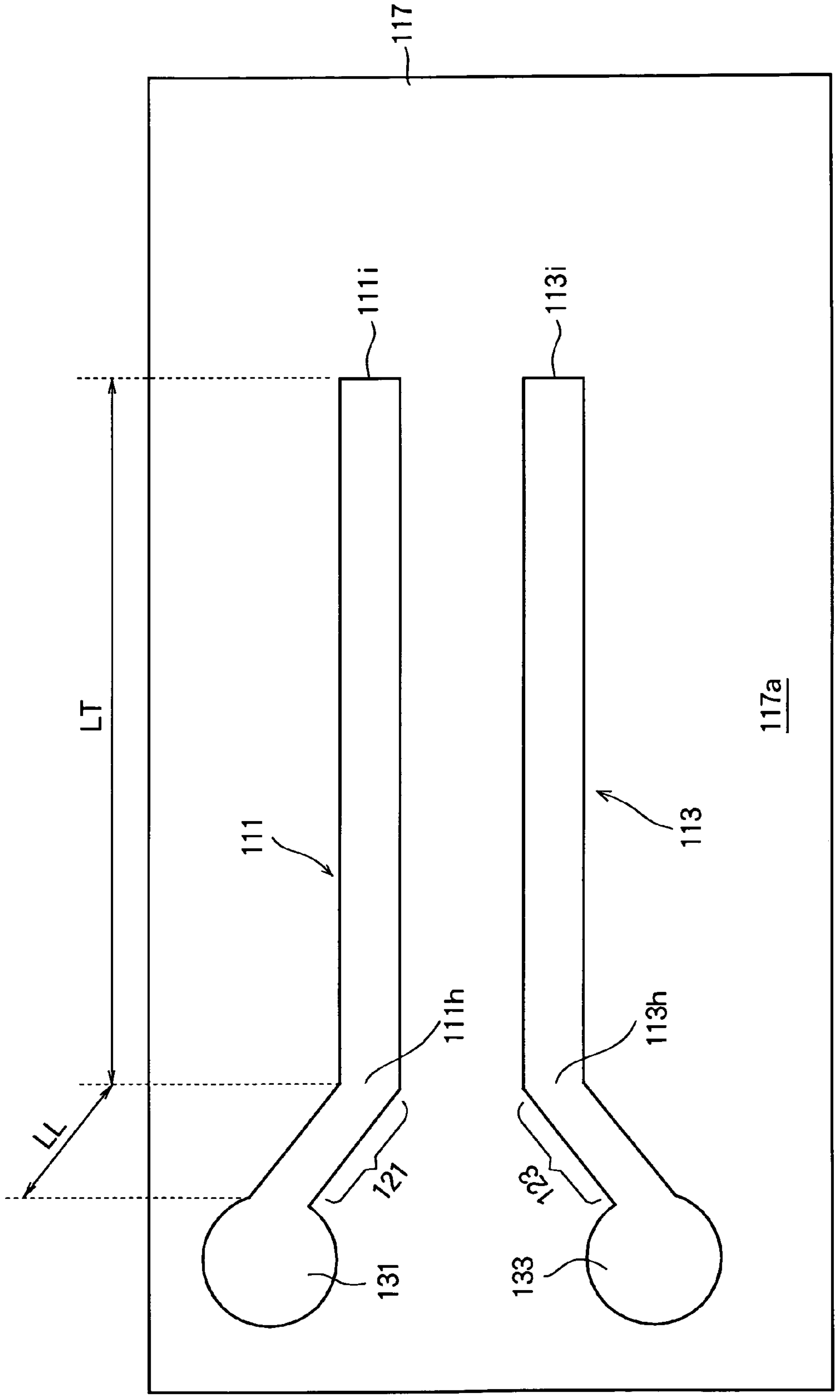
FIG. 8 is a top plan view of a structure used in time-domain reflectometry.
Figure 9:
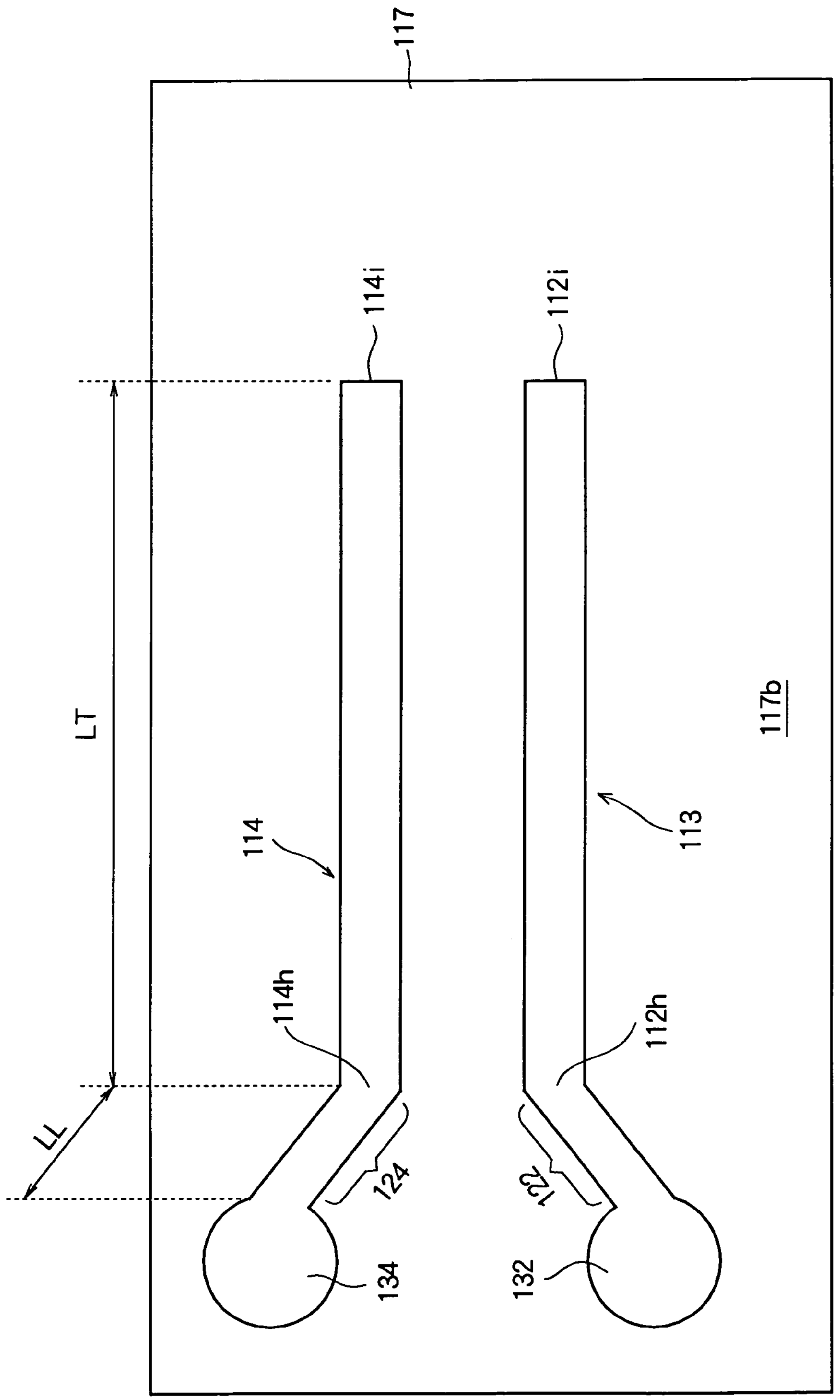
FIG. 9 is a bottom plan view of the structure in FIG. 8.

FIGS. 8 and 9 are a top plan view and a bottom plan view of a structure used for time-domain reflectometry, corresponding respectively to FIGS. 2 and 3. The structure is similar to the impedance conversion device 1 shown in FIGS. 1-7; a dielectric sheet 117 (corresponding to the dielectric sheet 17 in FIG. 1) has a first conductor 111 and a third conductor 113 mounted on its upper surface 117*a*, and a second conductor 112 and a fourth conductor 114 mounted on its lower surface 117*b*. The first to fourth conductors 111 to 114 correspond to the first to fourth conductors 11 to 14 in FIGS. 1-7, with the same thickness and width as the first to fourth conductors. The first conductor 111 and the second conductor 112 face each other across the dielectric sheet 117; the third conductor 113 and the fourth conductor 114 face each other across the dielectric sheet 117. Resistors 15 and 16 are not yet connected; the first to fourth conductors 111 to 114 are of equal length (LT=80 millimeters).

Strip-like leads 121 to 124 formed of the same material as the conductors are mounted at the ends 111*h* to 114*h* of the first to fourth conductors 111 to 114 (the left ends in FIGS. 8 and 9); connecting pads 131 to 134 are mounted at the ends of the leads 121 to 124. The length LL of the leads 121 to 124 is twelve millimeters.

Figure 10:
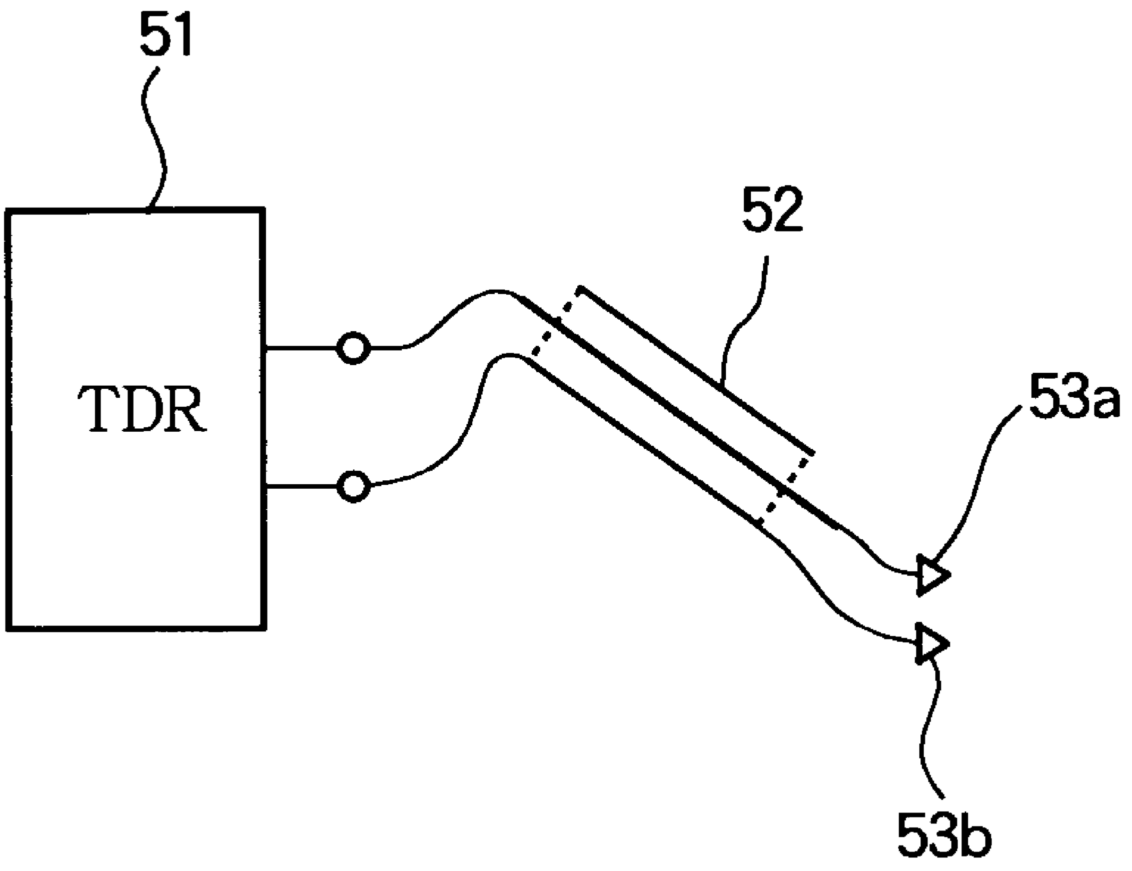
FIG. 10 depicts a time-domain reflectometer, and a coaxial cable and probes connected thereto.

Measurements were made of the impedance of each of the transmission lines formed by conductor 111 and conductor 112, conductor 112 and conductor 114, conductor 113 and conductor 114, and conductor 111 and conductor 113. As shown in FIG. 10, the TDR apparatus 51 had a coaxial cable 52 terminating in probes 53*a* and 53*b* for launching signal pulses and receiving reflected waves; the probes 53*a* and 53*b* were placed in contact with the conductors forming the transmission line so that signals could be input and their reflections received.

Specifically, to measure the impedance of the transmission line formed by conductor 111 and conductor 112, connecting pads 131 and 132 of conductor 111 and conductor 112 were contacted by probes 53*a* and 53*b*; to measure the impedance of the transmission line formed by conductor 113 and conductor 114, connecting pads 133 and 134 of conductor 113 and conductor 114 were contacted by probes 53*a* and 53*b*. To measure the impedance of the transmission line formed by conductor 111 and conductor 113, the other ends 111*i* and 113*i* of conductor 111 and conductor 113 were contacted by probes 53*a* and 53*b*; and to measure the impedance of the transmission line formed by conductor 112 and conductor 114, the other ends 112*i* and 114*i* of conductor 112 and conductor 114 were contacted by probes 53*a* and 53*b*.

Figure 11:
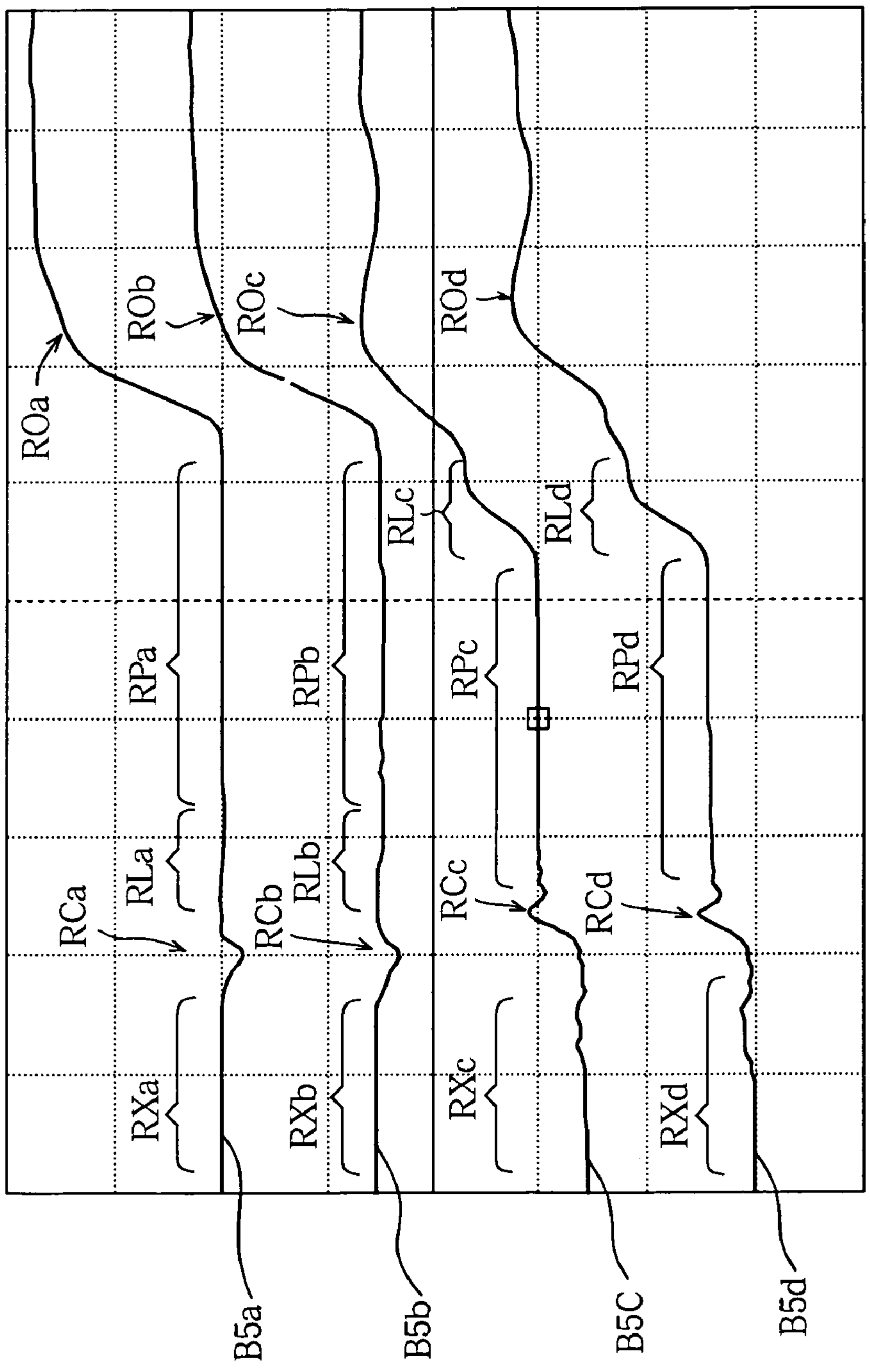
FIG. 11 shows exemplary waveforms obtained by time-domain reflectometry using the structure in FIGS. 8 and 9.

Exemplary waveforms that appeared on the display of the TDR apparatus 51 are shown in FIG. 11. In FIG. 11, curves B5*a*, B5*b*, B5*c*, and B5*d* indicate the waveforms obtained when conductor 111 and conductor 112, conductor 113 and conductor 114, conductor 111 and conductor 113, and conductor 112 and conductor 114, respectively, were contacted by probes 53*a* and 53*b*; the zero levels of different waveforms are mutually offset for visibility.

The leftmost regions RXa to RXd of these curves indicate the impedance of the coaxial cable 52 (50Ω); the regions adjacent to regions RXa to RXd on the right correspond to the sections in which probes 53*a* and 53*b* make contact with connecting pads 131 to 134 or the ends 111*i* to 114*i* of conductors 111 to 114; the central regions RPa to RPd indicate the impedance of conductors 111 to 114 (the impedance of the transmission line comprising conductors 111 and 112, the transmission line comprising conductors 113 and 114, the transmission line comprising conductors 111 and 113, and the transmission line comprising conductors 112 and 114); and the rightmost regions ROa to ROd indicate the impedance at the electrically open ends. Regions RLa and RLb of curves B5*a* and B5*b*, which are between the central regions RPa and RPb and the regions RCa to RCd corresponding to the contact sections of probes 53*a* and 53*b*, indicate the impedance of the leads 121 to 124; regions RLc and RLd of curves B5*c* and B5*d*, which are between the central regions RPc and RPd and the regions ROc and ROd corresponding to the electrically open ends, indicate the impedance of the leads 121 to 124.

The values shown in Table 1 can be read from the measured waveforms as the impedance of each pair of conductors.

TABLE 1

| Conductor Pair | Impedance |
|---|---|
| 111, 112 | 49.0 Ω |
| 113, 114 | 49.1 Ω |
| 111, 113 | 82.0 Ω |
| 112, 114 | 77.6 Ω |

The impedance conversion efficiency and waveform distortion of the novel impedance conversion device 1 were studied under various conditions.

Figure 12:
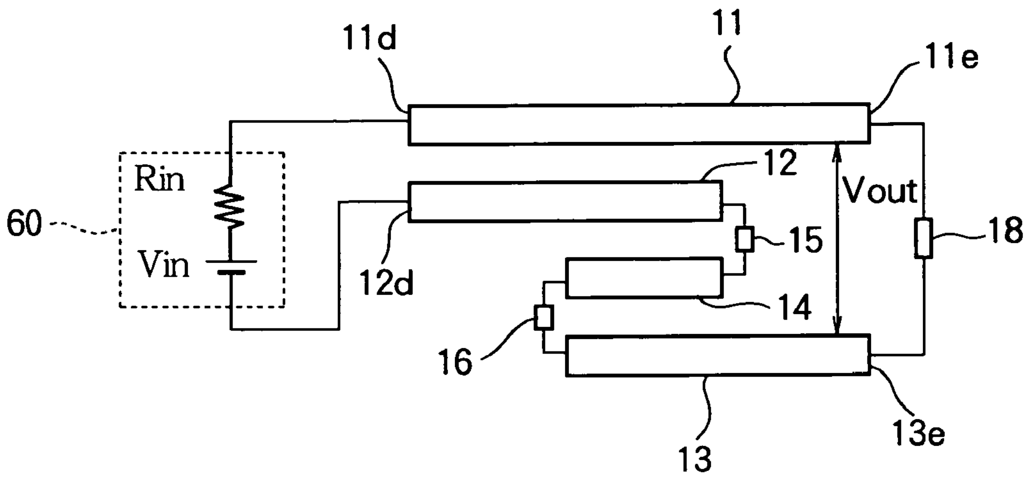
FIG. 12 schematically depicts the impedance conversion device in FIG. 1 with a direct current source connected on its input side and a load resistor connected on its output side.

In the first case studied, a load resistor 18 with a value equal to the second characteristic impedance z2 (82Ω) was connected between the output ends of the impedance conversion device 1, that is, between the output ends 11*e* and 13*e* of conductors 11 and 13, as shown in FIG. 12. In FIG. 12, conductors 11 to 14 are shown as coplanar to simplify the depiction of their electrical connection relationships and the depiction of resistors 15 and 16 is also simplified.

When a direct current voltage Vin is supplied from a direct current source 60 to the input end of the impedance conversion device 1 in FIGS. 1-7, that is, the input ends 11*d* and 12*d* of conductors 11 and 12, as shown in FIG. 12, (electromagnetic coupling among conductors 11 to 14 may be ignored in this case), the voltage Vout that appears across the output ends 11*e* and 13*e* is given by the following equation:

$$Vout=Vin\times\{R2/(2\times R2+R1+Rin)\}$$

where Rin is the internal resistance of the direct current source 60.

The internal resistance Rin is generally made equal to the input impedance R1; when Rin=R1, the above equation becomes:

$$Vout=Vin\times\{R2/(2\times R2+2\times R1)\} \quad (1)$$

If R1=50Ω and R2=82Ω, then:

$$\begin{aligned} Vout &= Vin\times\{82/(2\times 50+2\times 82)\} \\ &= Vin\times(82/264) \end{aligned} \quad (2)$$

If the value of Vin is five hundred millivolts (500 mV), then:

$$Vout=500\times 82/264=155\text{ mV} \quad (3)$$

Figure 13:
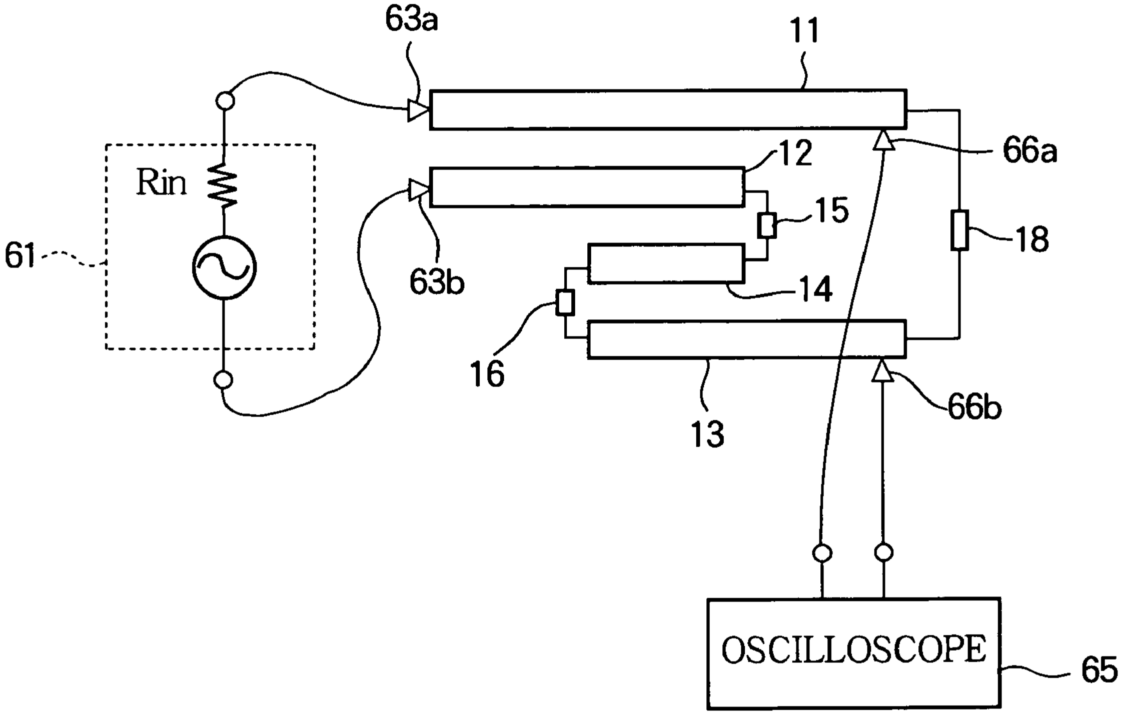
FIG. 13 schematically depicts the impedance conversion device in FIG. 1 with a pulse generator connected on its input side, a load resistor connected on its output side, and an oscilloscope connected to measure the voltage on the output side.

Next, the voltage that appeared at the output end when a voltage pulse train was applied from a pulse generator 61 to the input end of the impedance conversion device 1 in FIGS. 1-7, as shown in FIG. 13, was observed using an oscilloscope 65. In FIG. 13, conductors 11 to 14 are shown as being coplanar and resistors 15 and 16 are depicted in the same simplified way as in FIG. 12.

Figure 14:
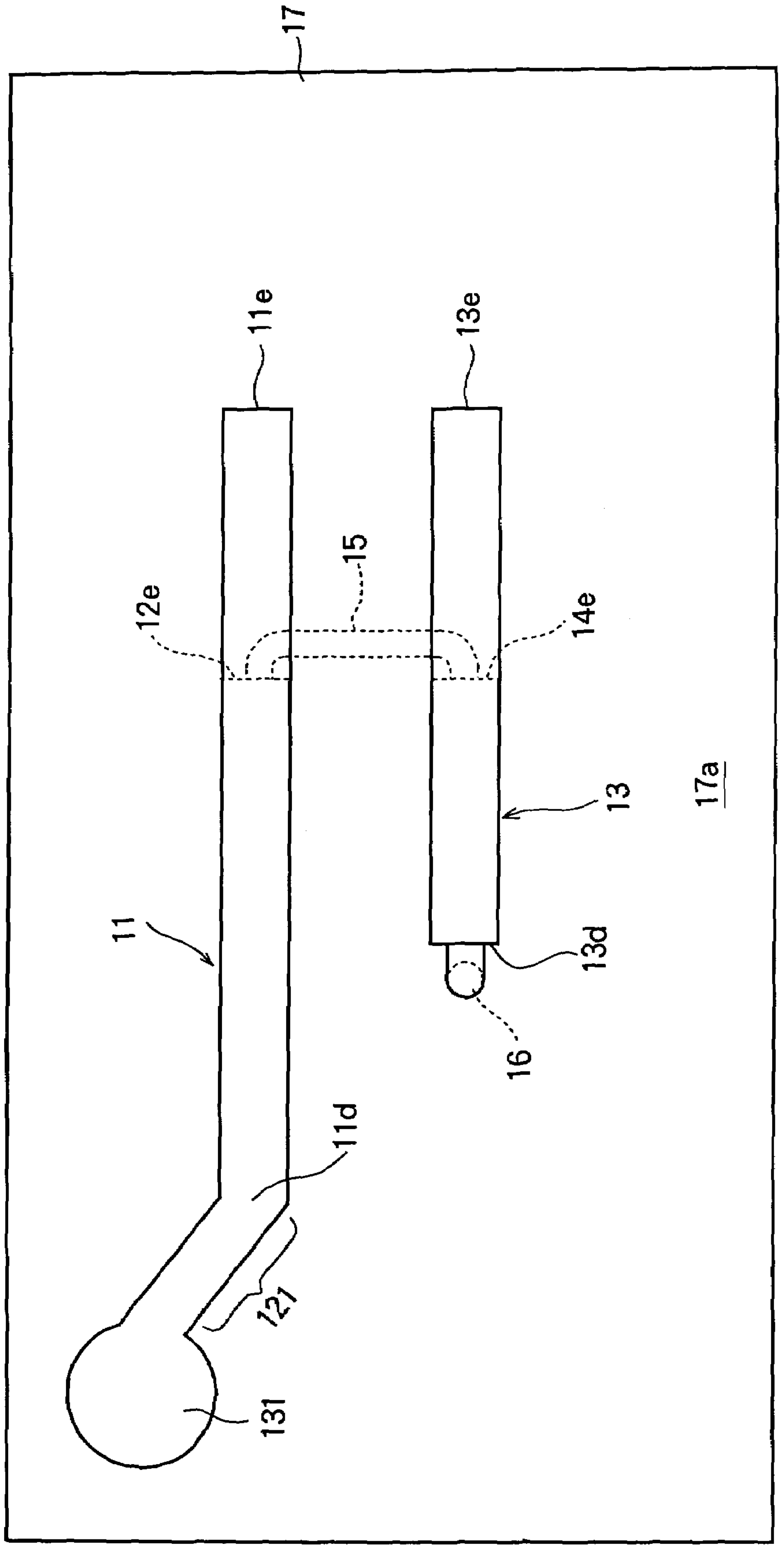
FIG. 14 is a top plan view of an impedance conversion device used in time-domain reflectometry.
Figure 15:
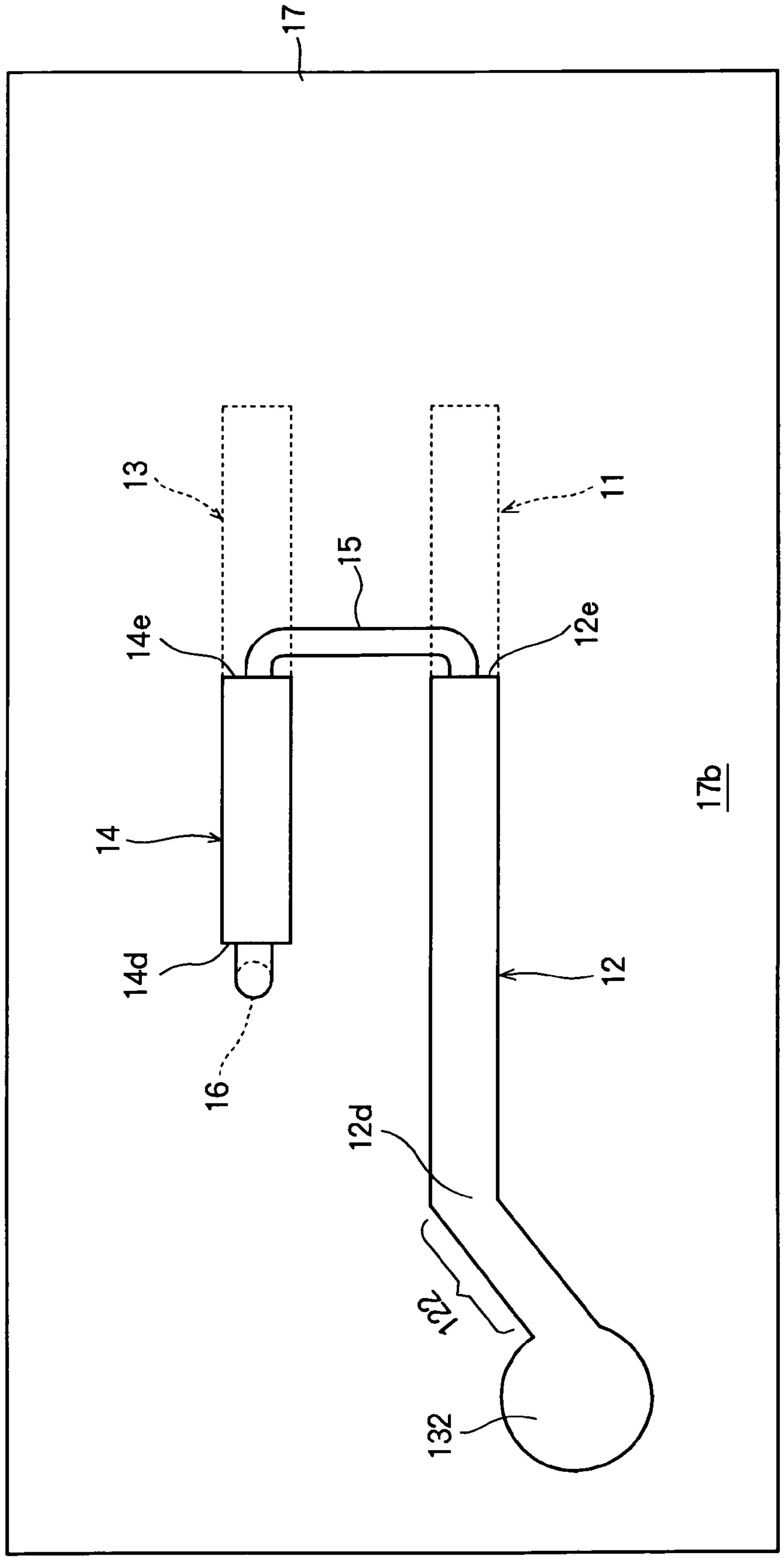
FIG. 15 is a bottom plan view of an impedance conversion device used in time-domain reflectometry.

The experimental impedance conversion device 1 shown in FIGS. 14 and 15 was used in this measurement. The experimental device 1 shown in FIGS. 14 and 15 is substantially the same as the impedance conversion device 1 shown in FIGS. 1-7, but has leads 121 and 122 disposed at the input ends 11*d* and 12*d* of conductors 11 and 12 and connecting pads 131 and 132 disposed at the ends of leads 121 and 122, similar to the structure shown in FIGS. 8 and 9. The dielectric sheet 17 extends farther than in FIGS. 1-7.

Measurements were made by connecting resistors 15 and 16 as shown in FIG. 13, in the same way as described with reference to FIGS. 1-7; a load resistor 18 having a resistance (RL) equal to the second characteristic impedance z2 (82Ω) was connected across the output ends (load ends) 11*e* and 13*e* of conductors 11 and 13. The central parts 11*b*, 12*b*, 13*b*, 14*b* of conductors 11, 12, 13, 14 had a length of two millimeters (2 mm).

A pulse generator 61 having an internal resistance Rin equal to the first impedance z1 (50Ω) and was used. The probes 63*a* and 63*b* of the pulse generator 61 were placed in contact with the connecting pads 131 and 132 on the input side. An oscilloscope 65 having high-impedance differential probes 66*a* and 66*b* was used. The measured waveforms are shown in FIG. 16.

Figure 16:
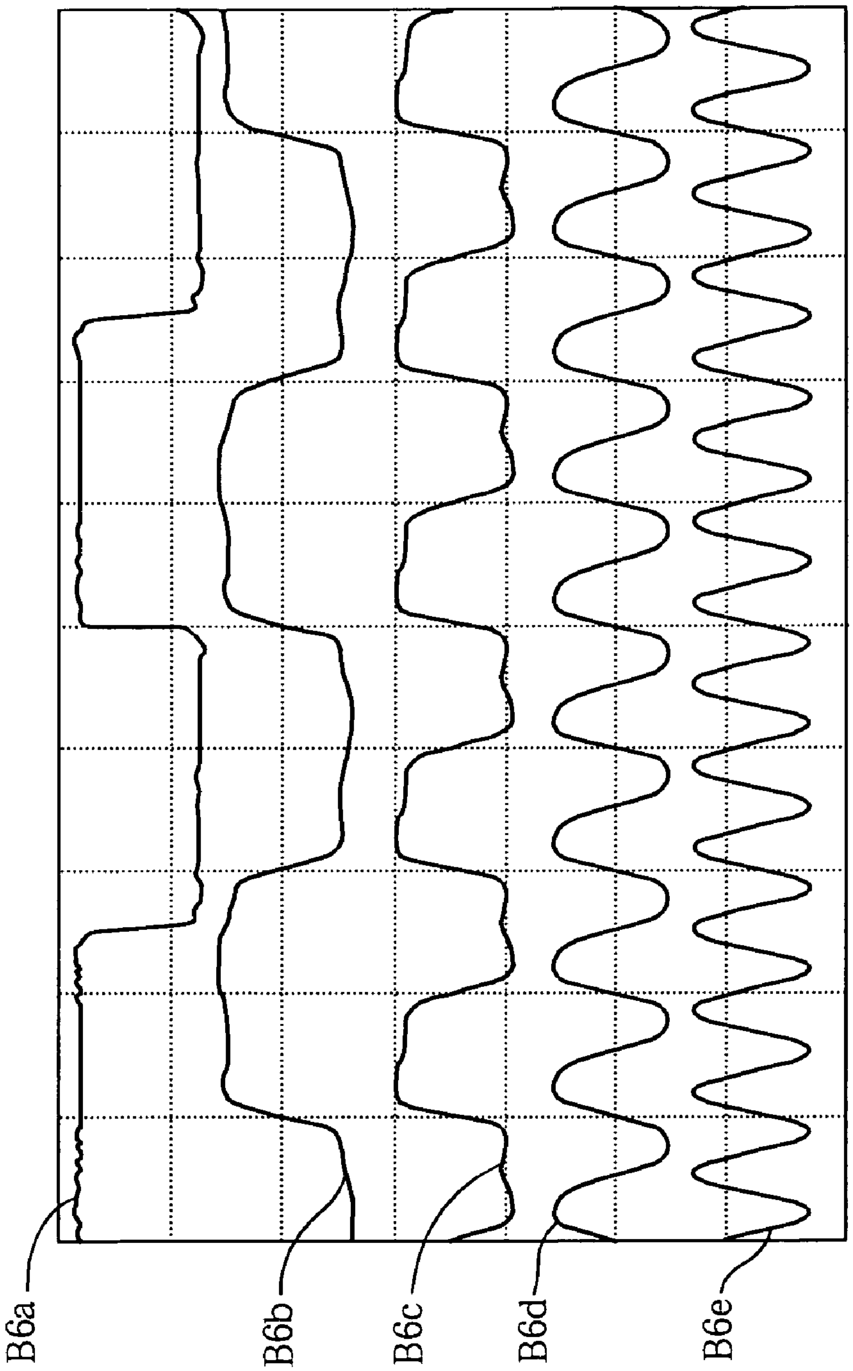
FIG. 16 shows exemplary waveforms obtained with the measurement setup shown in FIG. 13.

In FIG. 16, curves B6*a*, B6*b*, B6*c*, B6*d*, and B6*e* indicate waveforms obtained when the amplitude of the supplied pulses was 500 mV and the frequency of the pulse train was 100 MHz, 500 MHz, 1 GHz, 2 GHz, and 3 GHz, respectively.

The wave height values and rise times (the time required for the voltage level to increase from 20 percent to 80 percent of the wave height) determined from the measured waveforms are shown in Table 2.

TABLE 2

| Input frequency | Wave height (mV) | Rise time (ps) |
|---|---|---|
| 500 MHz | 255.1 | 67.3 |
| 1 GHz | 222.2 | 53.1 |
| 2 GHz | 255.1 | 66.5 |
| 3 GHz | 259.2 | 59.5 |

The difference between the wave height values obtained experimentally and the value obtained from equation (3) (the value of the output voltage when direct current is applied) is due to electromagnetic coupling in the transmission line.

For example, when the frequency is 500 MHz, the measured wave height was 255.1 mV. The difference between this value and the value obtained from equation (3) (255.1 mV−155 mV=100.1 mV) represents a voltage component induced by electromagnetic coupling, and indicates that impedance conversion has been carried out effectively.

Figure 17:
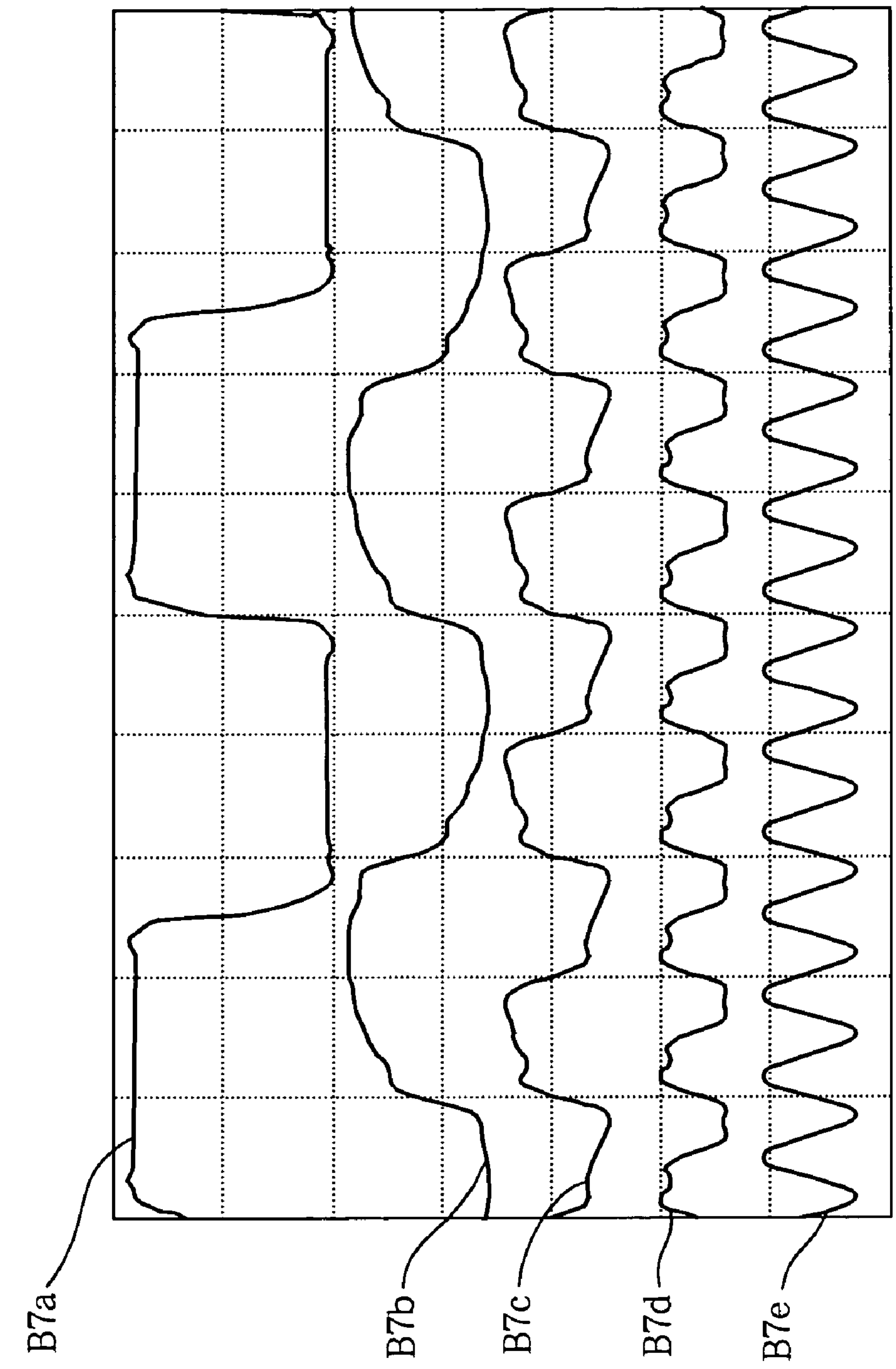
FIG. 17 shows exemplary waveforms obtained with the measurement setup shown in FIG. 13 with the output side left electrically open.

Next, similar measurements were made with the output ends of the impedance conversion device 1, more specifically the output ends 11*e* and 13*e* of conductors 11 and 13, left electrically open. The measurement conditions were the same as described above, except that to leave output ends 11*e* and 13*e* electrically open, the load resistor 18 was omitted. The measured waveforms are shown in FIG. 17. The wave height values determined from the measured waveforms are shown in Table 3.

TABLE 3

| Input frequency | Wave height (mV) |
|---|---|
| 100 MHz | 880 |
| 500 MHz | 880.1 |
| 1 GHz | 537.9 |
| 2 GHz | 391.2 |
| 3 GHz | 619.3 |

As shown in FIG. 17 and Table 3, the voltage level becomes higher when output ends 11*e* and 13*e* are left electrically open. Even when the output ends are left electrically open so that the circuit has no direct current connection, adequate energy is transmitted to the output ends of conductors 11 and 13. When there is no direct current connection, although energy is transmitted only by electromagnetic coupling, total reflection takes place at the load ends 11*e* and 13*e*, so twice as much voltage is obtained, and the apparent loss of energy due to impedance conversion is virtually nil.

When the output ends 11*e* and 13*e* of the impedance conversion device 1 are connected to a CMOS circuit gate, they are in nearly the same state as when left electrically open, so presumably the results will be nearly the same as shown in FIG. 17 and Table 3.

Though the resistor 16 (R2=50Ω) connected between conductors 13 and 14 causes mismatch reflection, and reflection this has a frequency dependence, if there were no mismatch, the waveforms should be smooth. The reason for the mismatch will be explained later with reference to FIG. 21.

Figure 18:
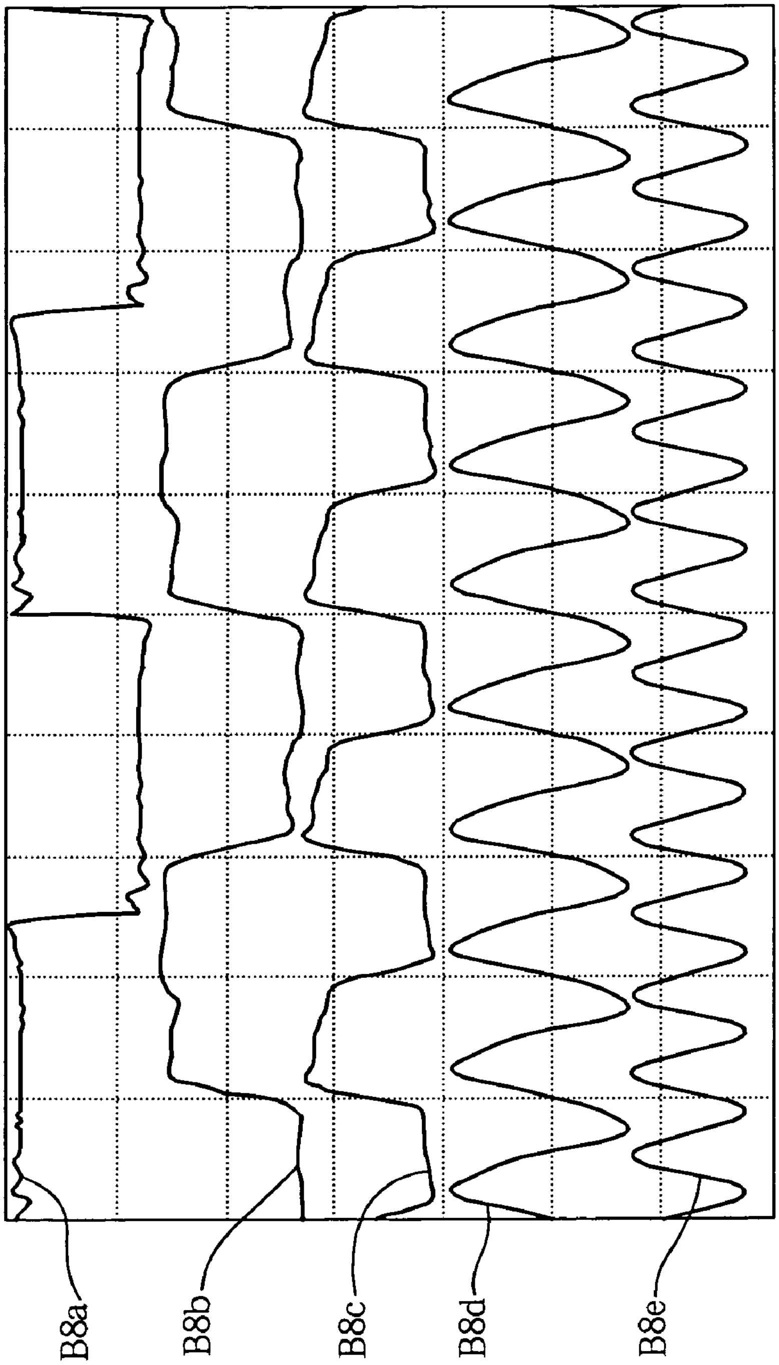
FIG. 18 shows exemplary waveforms obtained with the measurement setup shown in FIG. 13 with the central part of the conductor lengthened.

In the above examples (FIGS. 16 and 17), the central part had a length of two millimeters; FIG. 18 shows the measured waveforms for another experimental device in which the central part had a length of twenty millimeters. In FIG. 18, waveforms B8*a*, B8*b*, B8*c*, B8*d*, and B8*e* were obtained with pulse train frequencies of 100 MHz, 500 MHz, 12 GHz, 2 GHz, and 3 GHz, respectively. The wave height values determined from the measured waveforms are shown in Table 4.

TABLE 4

| Input frequency | Wave height (mV) |
|---|---|
| 500 MHz | 311.0 |
| 1 GHz | 244.8 |
| 2 GHz | 397.0 |
| 3 GHz | 251.4 |

FIG. 18 and Table 4 show a decrease in voltage and an increase in waveform distortion. The reason is thought to be the long distance between boundaries 1*f* and 1*g*, which causes a relatively long elapse of time from reflection at one boundary to reflection at the other boundary, leading to multiple reflections that distort the waveforms.

As described above, the characteristic impedance of the duo-parallel parts 1*a* and 1*c* and the characteristic impedance of the quadri-parallel part 1*b* are slightly different. Multiple reflections therefore occur. In order to avoid multiple reflection resonance, the quadri-parallel part should have a length not exceeding one-fourth of the fundamental wavelength of the signal that is transmitted. If the specific inductive capacity of the transmission line is four, then the electromagnetic wave speed is $1.5\times10^8$ m/s, and if the frequency of the pulse train supplied from the pulse generator 61 is 3 GHz, it follows that the wavelength is 50 millimeters, one-fourth of which is 12.5 millimeters.

The length of the quadri-parallel part 1*b* need only be sufficient for electromagnetic waves to reshape the electromagnetic space between the parallel conductors. Interference between the conductors is caused by the spreading of the electromagnetic waves in a direction orthogonal to their direction of propagation, and the spreading speed is the same as the speed with which the electromagnetic waves propagate along the transmission line. Reshaping of the electromagnetic space is possible if an electromagnetic wave can travel back and forth between the conductors about five times; the length corresponding to the delay time is a length ten times as long as the larger of the two distances separating the conductors (the larger of the distance (170 micrometers) between the first conductor 11 and the second conductor 12 and the distance (100 micrometers or 0.1 millimeter) between the first conductor 11 and the third conductor 13). Thus, if the larger of the two distances between the conductors is 170 micrometers, ten times that length is 1.7 millimeters; the quadri-parallel structure is effective if its length is equal to or greater than this value.

Figure 19:
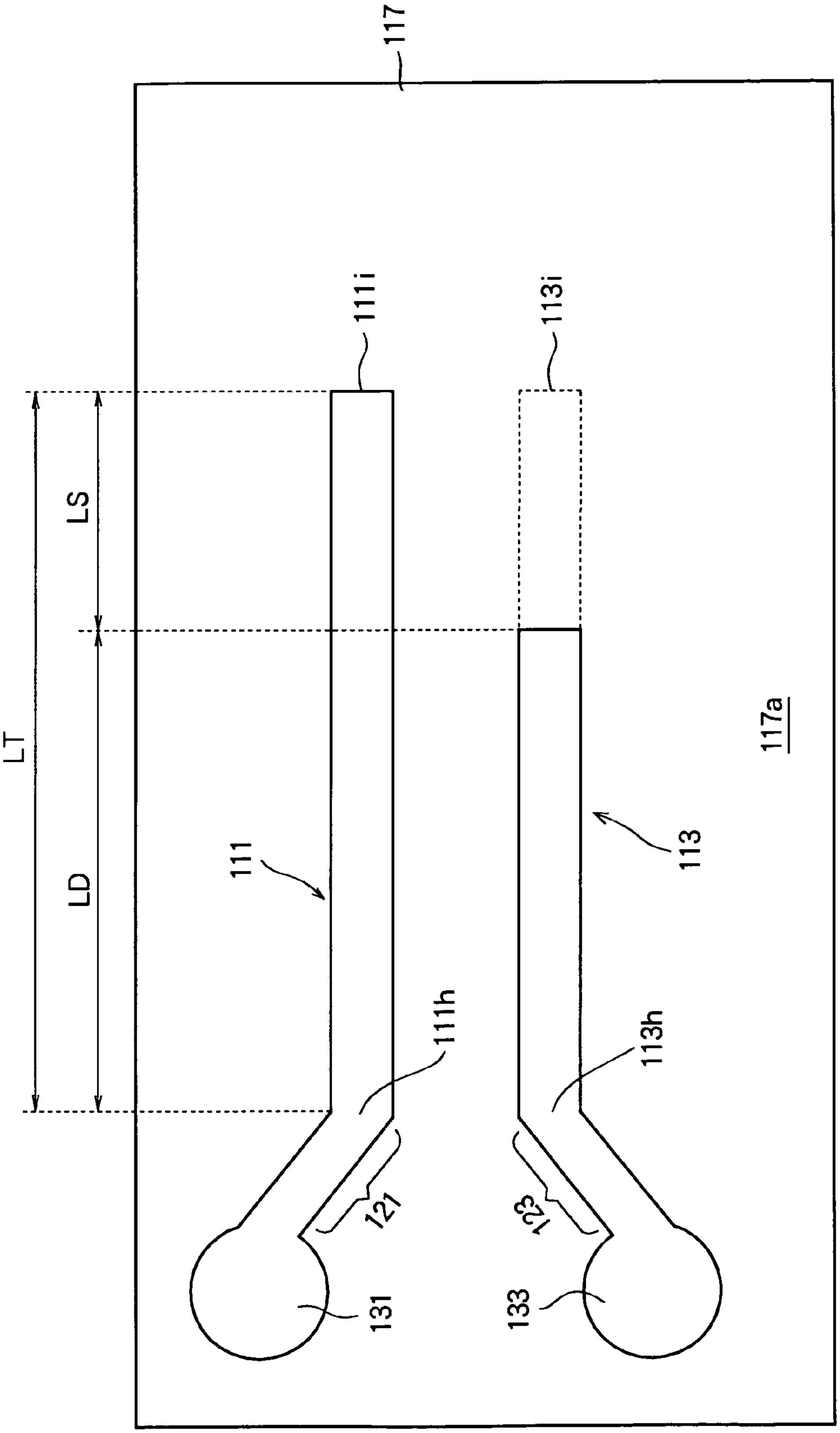
FIG. 19 is a top plan view of another structure used in time-domain reflectometry.
Figure 20:
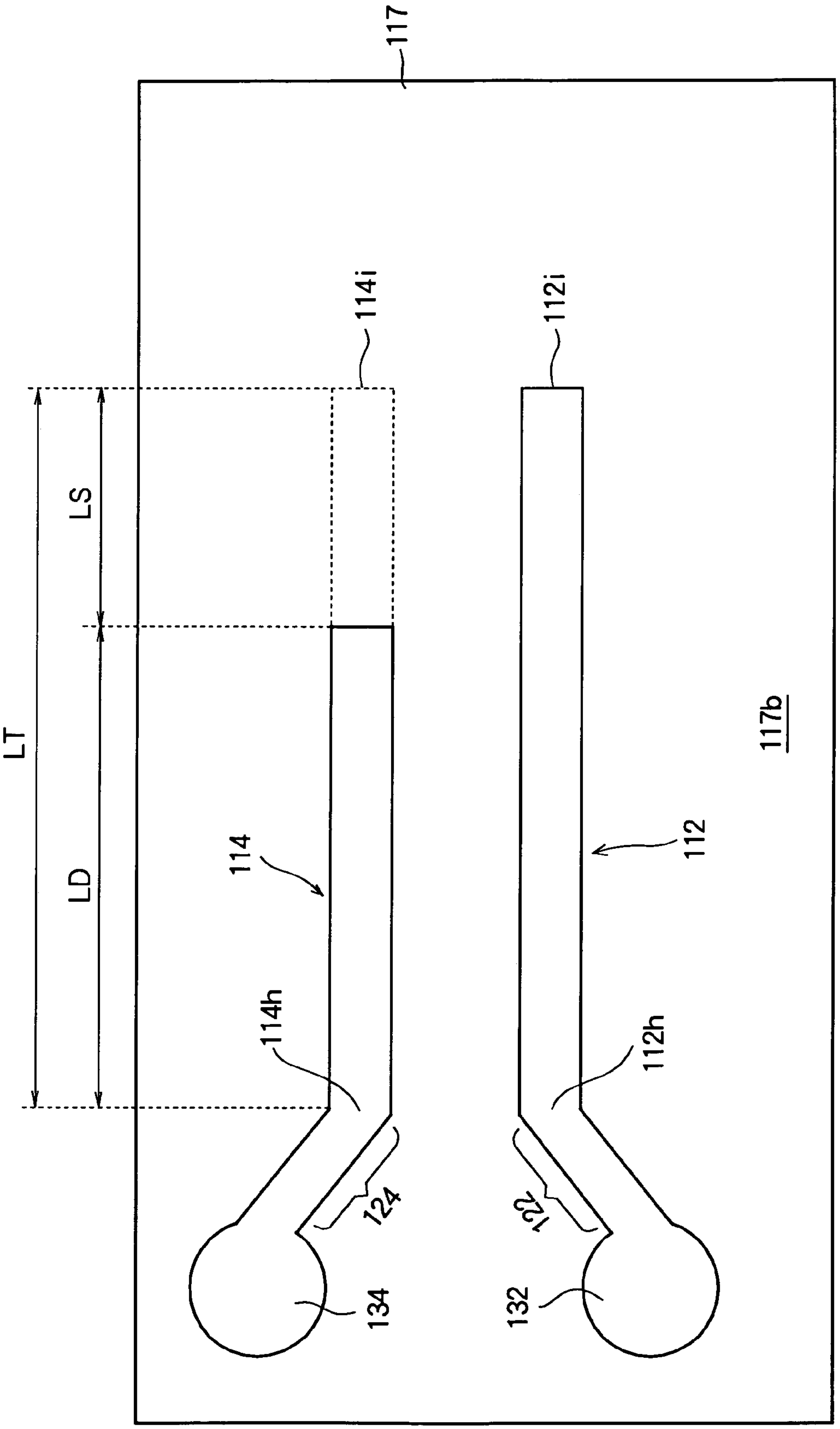
FIG. 20 is a bottom plan view of the structure in FIG. 19.
Figure 21:
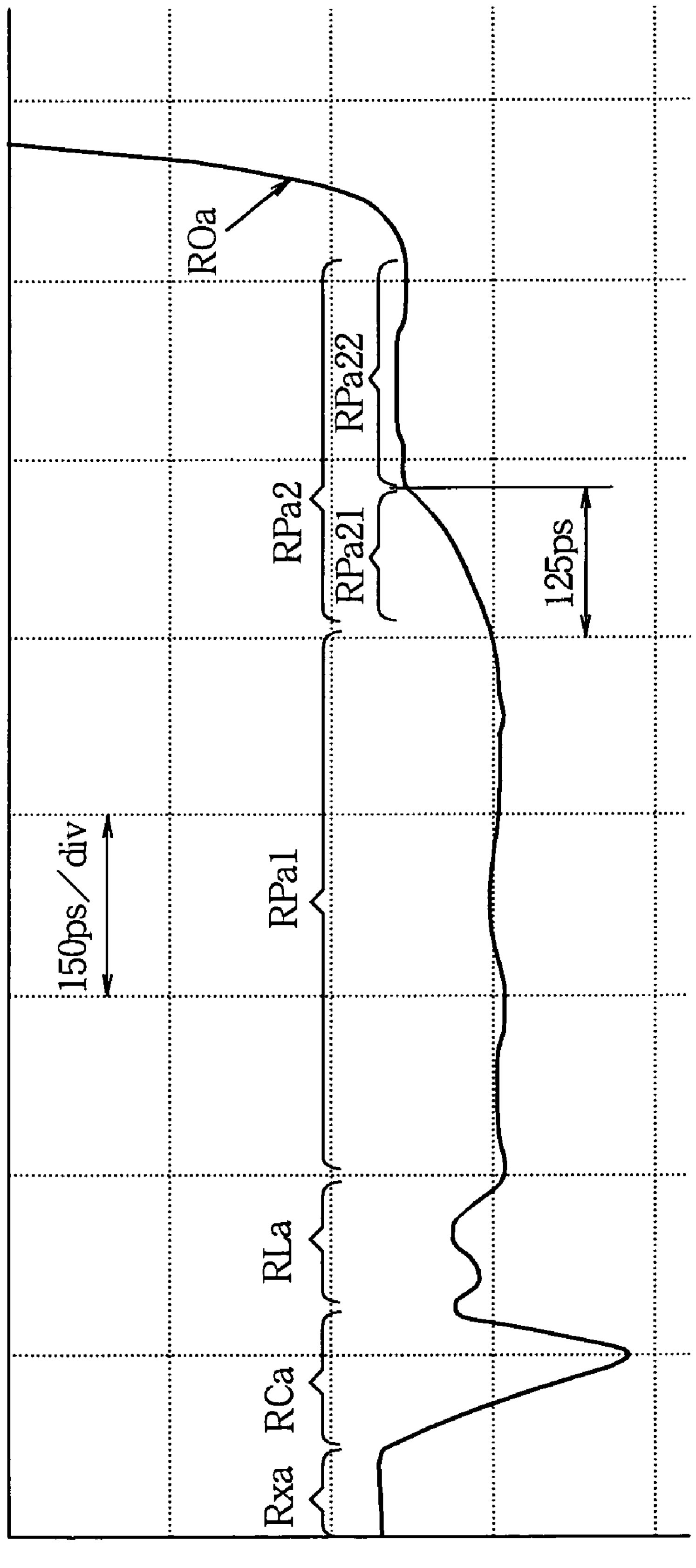
FIG. 21 shows an exemplary waveform obtained by time-domain reflectometry using the structure in FIGS. 19 and 20.

The characteristic impedance of the quadri-parallel part 1*b* and the characteristic impedance of the duo-parallel part 1*a* and 1*c* were confirmed to be different using time-domain reflectometry. FIGS. 19 and 20 show the structure used in this time-domain reflectometry experiment. The structure shown in FIGS. 8 and 9 was further modified by removing the parts near the ends 113*i* and 114*i* of the third conductor 113 and the fourth conductor 114. The length LS of the removed parts was 25 millimeters; the section with the removed parts constituted the duo-parallel part. The remaining section (the section with no parts removed), which had a length LD of 55 millimeters, constituted the quadri-parallel part. Connecting pads 131 and 132 of the first conductor 111 and the second conductor 112 of this structure were contacted by probes 53*a* and 53*b* of the TDR apparatus 51. The measured waveforms are shown in FIG. 21. The longitudinal axis in FIG. 21 is enlarged compared to that in FIG. 11.

In FIG. 21, region RXa corresponds to a section of the coaxial cable 52, region RCa corresponds to leads 121 and 122, region RPa1 corresponds to the quadri-parallel part (length LD), region RPa2 corresponds to the duo-parallel part (length LS), and region ROa corresponds to the electrically open ends.

The impedance of the quadri-parallel part (length LD) shown in FIG. 21 is 48Ω, and the impedance of the right-side region RPa22 (excluding the region RPa21 adjacent to the region RPa1 corresponding to the quadri-parallel part) of the duo-parallel part (length LS) is 51.2Ω; reflection occurs due to this difference. The upper limit described above on the length of the quadri-parallel part 1*b* is set in order to prevent reflection from occurring repeatedly and leading to multiple reflections.

In the region RPa2 corresponding to the duo-parallel part, the characteristic impedance changes gradually in the region RPa21 adjacent to the region RPa1 corresponding to the quadri-parallel part. This part corresponds to 125 picoseconds of time, which is the sum of the slump due to the rise time of the step waveform of the TDR apparatus 51 (35 picoseconds, the same as the slump at the contact section RCa and the electrically open end ROa) and the time taken to detect the change; these factors cannot be separated accurately, but the physical phenomena that operate during detection are similar to the reshaping of the electromagnetic space described above.

Next, electromagnetic coupling between the conductors, in other words, crosstalk, will be described with reference to FIGS. 22 and 23.

Figure 22:
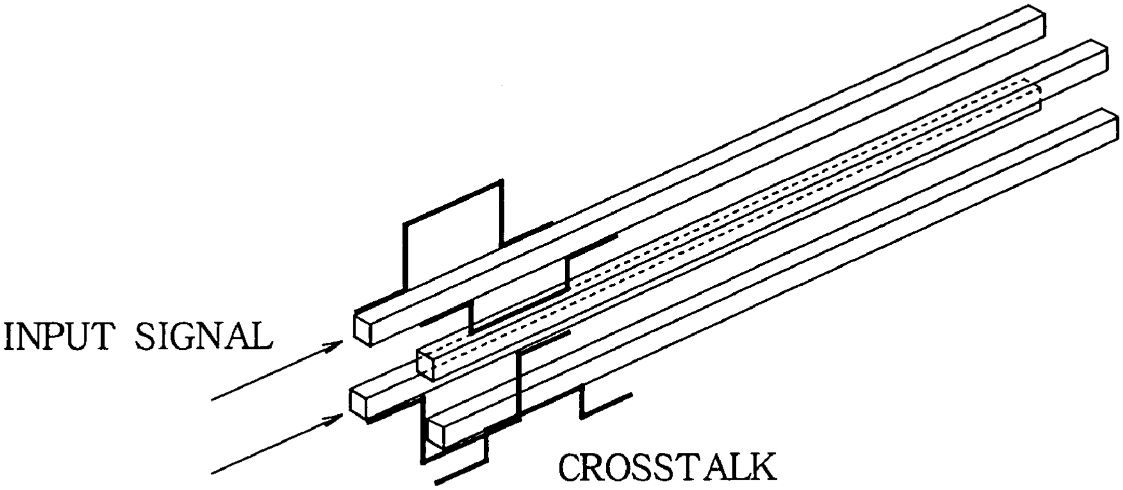
FIG. 22 is a perspective view illustrating crosstalk between mutually adjacent conductors.
Figure 23:
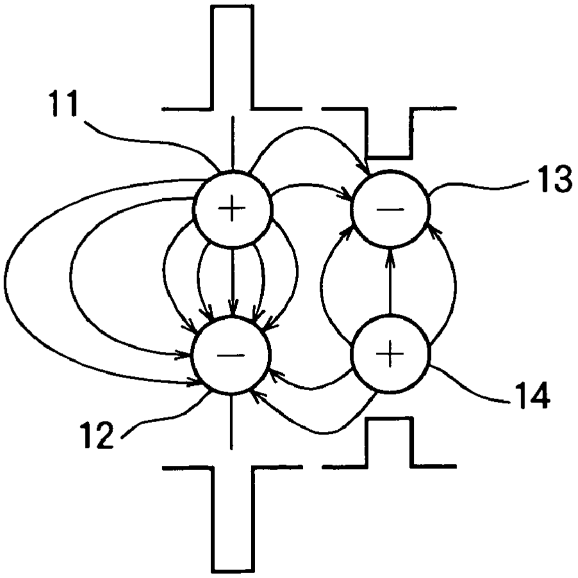
FIG. 23 is a sectional view illustrating crosstalk between mutually adjacent conductors.

As shown in FIG. 22, the pulse energy input to one of the parallel conductors 11 to 14 causes various combinations of interference on adjacent conductors; the optimal state is ultimately the one in which inverted waveform energy is induced in the proximate conductors by electromagnetic interference as shown in FIG. 23, with the crosstalk energy corresponding to the electromagnetic dispersion energy. This is in forward waves. Though backward waves are also induced, they are omitted here. The input induces vertical coupling (coupling between the vertically adjacent conductors 11 and 12 in FIG. 1), and so the upper-left conductor becomes the output of the adjacent vertical coupling. With horizontal coupling (coupling between the horizontally adjacent conductors in FIG. 1), however, the energy becomes the sum of the original energy on one side and the energy of the far end composite wave (upper right); a voltage of 250 mV was obtained experimentally, which is larger than the divided direct current voltage of 155 mV. The difference represents an improvement in the efficiency of impedance conversion. This energy state between parallel conductors is achieved if a relationship corresponding to the one shown in FIGS. 22 and 23 is formed for even an instant (the time during which interference occurs at the speed of light); the minimum length is thus the length described above.

Figure 24:
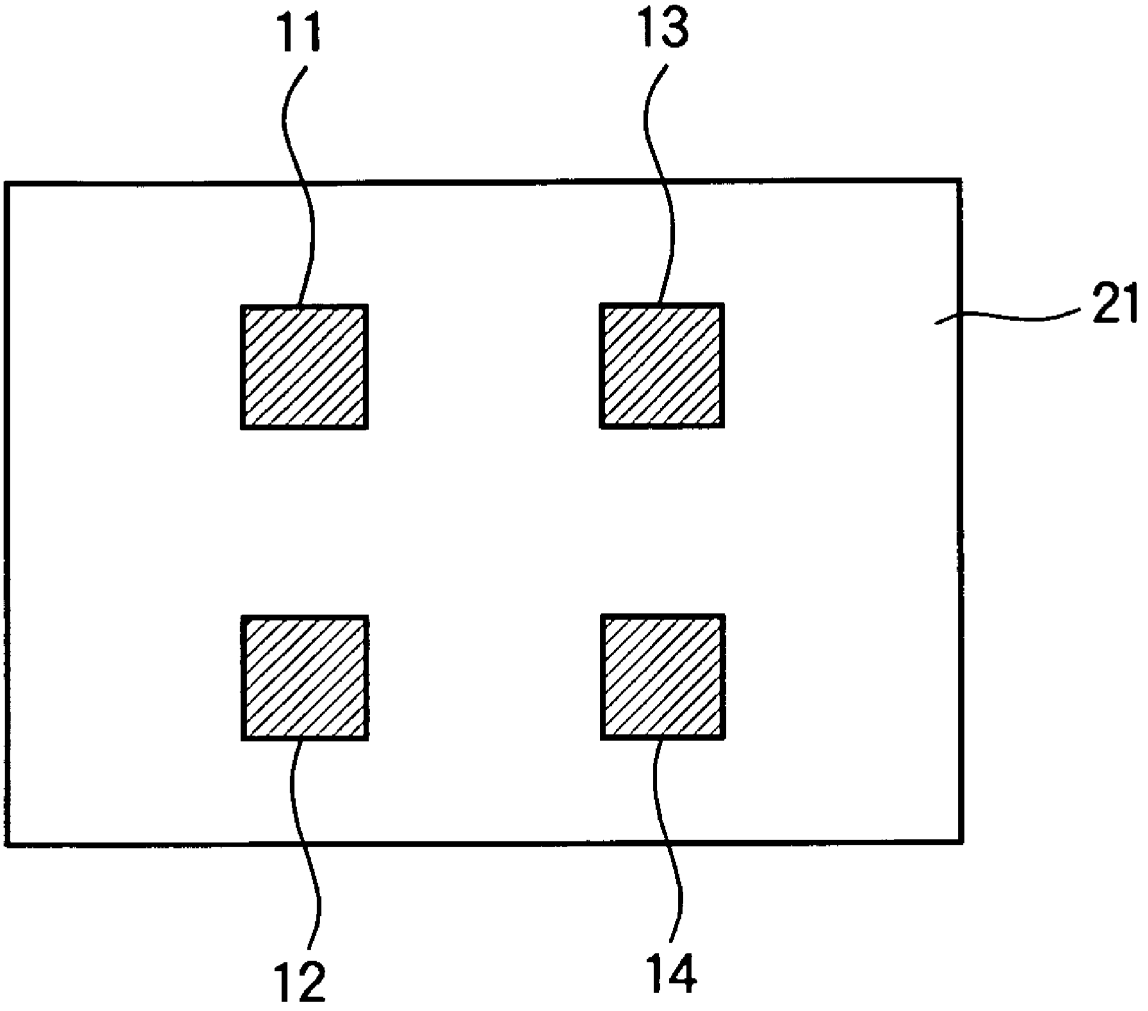
FIG. 24 is a sectional view illustrating another embodiment of the invention.

Though the conductors are disposed on the upper surface and lower surface of the dielectric sheet in FIGS. 1-7, a structure in which conductors 11 to 14 are all embedded in a dielectric material 21 as shown in FIG. 24 (a sectional view similar to FIG. 6) is also possible. The first to fourth conductors 11 to 14 may be formed in the same way as two pairs of stacked pair conductors are formed.

In the above embodiment, the first to third conductors 11 to 13 have input parts 11*a* and 12*a* and output parts 11*c* and 13*c* as well as central parts 11*b*, 12*b*, and 13*b*, but the impedance conversion device may comprise only the central parts; the input parts 11*a* and 12*a* and output parts 11*c* and 13*c* may be omitted.

Although the first to fourth conductors 11 to 14 extend in straight lines in the above embodiment, they may be curved. The cross-sectional shapes and dimensions of the first to fourth conductors 11 to 14 need not all be the same; some may differ from the others.

Those skilled in the art will recognize that further variations are possible within the scope of the invention, which is defined in the appended claims.

What is claimed is:

1. An impedance conversion device comprising:

a first conductor having a first end and a second end;

a second conductor having a first end and a second end, disposed relative to the first conductor so that the first conductor and the second conductor form a first transmission line having a first characteristic impedance;

a third conductor having a first end and a second end, disposed relative to the first conductor so that the first conductor and the third conductor form a second transmission line having a second characteristic impedance different from the first characteristic impedance;

a fourth conductor having a first end and a second end, disposed relative to the second conductor so that the second conductor and the fourth conductor form a third transmission line having the second characteristic impedance, and disposed relative to the third conductor so that the third conductor and the fourth conductor form a fourth transmission line having the first characteristic impedance;

a first resistor having a resistance equal to the first characteristic impedance, having a first end connected to the second end of the second conductor and a second end connected to the second end of the fourth conductor; and a second resistor having a resistance equal to the second characteristic impedance, having a first end connected to the first end of the third conductor and a second end connected to the first end of the fourth conductor; wherein the second ends of the second and fourth conductors are mutually proximate; and the first ends of the third and fourth conductors are mutually proximate.

2. The impedance conversion device of claim 1, wherein:

the first conductor has an input part, a central part, and an output part;

the second conductor forms said first transmission line with the input part and the central part of the first conductor;

the third conductor forms said second transmission line with the central part and the output part of the first conductor; and the fourth conductor forms said third transmission line with a part of the second conductor facing the central part of the first conductor, and forms said fourth transmission line with a part of the third conductor facing the central part of the first conductor.

3. The impedance conversion device of claim 2, wherein the first, second, third, and fourth conductors are mutually parallel.

4. The impedance conversion device of claim 2, wherein the input part, the central part, and the output part of the first conductor are mutually contiguous.

5. The impedance conversion device of claim 1, wherein:

the first conductor and the second conductor are mutually spaced apart in a first direction;

the third conductor and the second conductor are mutually spaced apart in the first direction;

the first conductor and the third conductor are mutually spaced apart in a second direction orthogonal to the first direction; and the second conductor and the fourth conductor are mutually spaced apart in the second direction.

6. The impedance conversion device of claim 5, wherein each one of the first, second, third, and fourth conductors has a rectangular cross section with a first side extending in the first direction and a second side extending in the second direction.

7. The impedance conversion device of claim 1, wherein the first and second conductors are mutually separated by a first distance, the first and third conductors are mutually separated by a second distance, and the fourth conductor is at least ten times as long as the first distance and at least ten times as long as the second distance.

8. The impedance conversion device of claim 7, wherein the first, second, third, and fourth conductors transmit a signal having a fundamental wavelength, and the fourth conductor has a length not exceeding one-fourth of said fundamental wavelength.

9. The impedance conversion device of claim 1, wherein the first, second, third, and fourth conductors transmit a signal having a fundamental wavelength, and the fourth conductor has a length not exceeding one-fourth of said fundamental wavelength.

10. The impedance conversion device of claim 1, further comprising a dielectric member having two major surfaces, the first and third conductors being disposed on one of said major surfaces, the second and fourth conductors being disposed on another one of said major surfaces.

11. The impedance conversion device of claim 1, further comprising a dielectric member within which the first, second, third, and fourth conductors are embedded.

* * * * *